(12) United States Patent
Meshcheryakov et al.

(10) Patent No.: US 11,866,647 B2
(45) Date of Patent: Jan. 9, 2024

(54) ELECTROCHROMIC MATERIAL AND METHOD OF MANUFACTURING THEREOF

(71) Applicant: COMBERRY, LLC, Ulyanovsk (RU)

(72) Inventors: Vladimir Igorevich Meshcheryakov, Ozyory (RU); Anton Mikhailovich Manakhov, Ivanovo (RU); Nikolay Anatolievich Pogorelov, Ulyanovsk (RU); Vladimir Aleksandrovich Chugunov, Ulyanovsk (RU)

(73) Assignee: COMBERRY, LLC, Ulyanovsk (RU)

( * ) Notice: Subject to any disclaimer, the term of this patent is extended or adjusted under 35 U.S.C. 154(b) by 391 days.

(21) Appl. No.: 17/261,060

(22) PCT Filed: Jul. 8, 2019

(86) PCT No.: PCT/RU2019/050105
§ 371 (c)(1),
(2) Date: Feb. 18, 2021

(87) PCT Pub. No.: WO2020/018002
PCT Pub. Date: Jan. 23, 2020

(65) Prior Publication Data
US 2021/0269706 A1 Sep. 2, 2021

(30) Foreign Application Priority Data
Jul. 18, 2018 (RU) .................. RU2018126491

(51) Int. Cl.
*C09K 9/00* (2006.01)
*C01G 41/02* (2006.01)
(Continued)

(52) U.S. Cl.
CPC .............. *C09K 9/00* (2013.01); *C01G 41/02* (2013.01); *C23C 14/0605* (2013.01);
(Continued)

(58) Field of Classification Search
CPC ...... C09K 9/00; C01G 41/02; C23C 14/0605; C23C 14/0635; C23C 14/14;
(Continued)

(56) References Cited

U.S. PATENT DOCUMENTS

2019/0051936 A1* 2/2019 Meshcheryakov ..... H01M 6/40

\* cited by examiner

*Primary Examiner* — Andrew J. Oyer
(74) *Attorney, Agent, or Firm* — Bardmesser Law Group

(57) ABSTRACT

Inorganic electrochromic materials and methods of manufacturing utilize a reactive PDC magnetron, where co-sputtering synthesis of electrochromic materials are performed: (1) directly from carbide targets; (2) from relevant transition metals and graphite target, as well as non-metal elements such as Si, Ge, P, B, etc.; (3) directly from composite targets (fine powder mixture of transition metals, non-metal elements and graphite powder). Sputtering may be performed instantly from 1 to 4 targets. For co-sputtering, a combination of gas mixtures may be used: $Ar/O_2/N_2$, $Ar/H_2/N_2/O_2$, $Ar/NH_3/O_2$, $Ar/CO/N_2/O_2$, $Ar/CO/H_2/N_2/O_2$, $Ar/CH_4/N_2/O_2$ and $Ar/NH_3/CO/N_2/O_2$. This allows obtaining electrochromic materials with increased electronic and ionic conductivity, higher coloration and good cycling (lifetime). Moreover, different tints of blue as well as gray, black and brown colors neutral to the eye may be obtained. Sputtered electrochromic films were additionally improved by "thermo-splitting" pre-intercalated thin films. This allows achieving higher coloring and bleaching speed and better lifetime.

28 Claims, 5 Drawing Sheets

(51) Int. Cl.

| | |
|---|---|
| *C23C 14/06* | (2006.01) |
| *C23C 14/14* | (2006.01) |
| *C23C 14/35* | (2006.01) |
| *H01G 11/46* | (2013.01) |
| *H01M 4/04* | (2006.01) |
| *H01M 4/133* | (2010.01) |
| *H01M 4/134* | (2010.01) |

(52) U.S. Cl.
CPC .......... *C23C 14/0635* (2013.01); *C23C 14/14* (2013.01); *C23C 14/352* (2013.01); *H01G 11/46* (2013.01); *H01M 4/0426* (2013.01); *H01M 4/133* (2013.01); *H01M 4/134* (2013.01); *C01P 2002/52* (2013.01); *C01P 2006/40* (2013.01); *C01P 2006/60* (2013.01)

(58) Field of Classification Search
CPC .............. C23C 14/352; C23C 14/0036; C23C 14/0057; C23C 14/083; C23C 14/081; H01G 11/46; H01M 4/0426; H01M 4/133; H01M 4/134; C01P 2002/52; C01P 2006/40; C01P 2006/60; Y02E 60/10; G02F 1/1524

See application file for complete search history.

ELECTROCHROMIC MATERIAL AND METHOD OF MANUFACTURING THEREOF

BACKGROUND OF THE INVENTION

Field of the Invention

The present invention relates to electrochromic field, in particular, to electrochromic (EC) materials of neutral to eye colors, and to methods of manufacturing such materials. More particularly, the present invention relates to the field of inorganic EC materials with advanced characteristics and to their manufacturing technologies aimed at obtaining optimal material structure. The materials possess extended color range (tints of blue, gray, black, brown) as well as higher conductivity, which allows deposition of thicker EC layers (up to 10 µm) without a dramatic drop in their performance. In addition, the materials are promising for the use as cathode materials in primary or secondary energy sources.

Description of the Related Art

Over the past several decades, tungsten oxide ($WO_3$) has been extensively studied due to its interesting physical and chemical properties. $WO_3$ shows a strong reversible field-aided ion intercalation behavior. Ions such as $Li^+$, $Na^+$, $K^+$, etc. may be easily introduced into the host $WO_3$ matrix. This ion insertion is combined with a strong change in the electronic and optical properties of the oxide, and this effect is exploited intensively in EC devices, such as large area information displays, rear-view mirrors, smart windows for automobiles and energy saving architecture due to their low power consumption and high energy efficiency, see [1-4]. Amorphous $WO_3$ film synthesized by magnetron sputtering has shown to be an excellent candidate for EC applications, see [5, 6]. When ions are intercalated, the charge-compensating electrons enter the localized states. The electronic structure of $WO_3$ is modified, and this strongly alters the optical properties of the material from transparent to a deep blue color. A number of dopant and approaches for the doping the host amorphous $WO_3$ material by transition metals and nonmetallic elements have been investigated for the enhancement of their EC and electrochemical properties, see [7-16].

U.S. Patent Publication No. 20070097480 A1 discloses an electrochromic single-phase compound of formula $W_{1-z}Ta_xO_{3-x/2}$, wherein x has a value in a range of approximately 0.15 to approximately 0.5, produced by pulse laser deposition as a thin film. In particular, U.S. Patent Publication No. 2007097480 A1 discloses $Ta_{0.1}W_{0.9}O_{2.95}$ changing color from light pink to cadet blue, and $Ta_{0.3}W_{0.7}O_{2.85}$ from light green to light brown-green under $H^+$ ion intercalation at −0.7 V. The electrochromic material may be used in "smart" windows, mirrors, information displays and variable emittance surfaces. However, the material of U.S. Patent Publication No. 20070097480 A1 fails to provide a neutral color at colored and bleached states.

U.S. Patent Publication No. 20090323157 A1 discloses an electrochromic material including at least one of the following compounds: oxides of tungsten (W), niobium (Nb), tin (Sn), bismuth (Bi), vanadium (V), nickel (Ni), iridium (Ir), antimony (Sb) and tantalum (Ta), alone or as a mixture, and optionally including an additional metal such as titanium (Ti), rhenium (Re) or cobalt (Co), possible to switch glazing between a bleached state and a colored state characterized by a light transmission of 55/2.5%, 50/1%, 40/0.01%. However, U.S. Patent Publication No. 2009323157 A1 is silent on providing a material with neutral color at colored and bleached states.

U.S. Patent Publication No. 20100245973 A1 discloses an electrochromic material based on $WO_{3-y}$ (0<y≤0.3), where intercalation of lithium ions into tungsten oxide causes the tungsten oxide to change from transparent (bleached state) to blue (colored state), and generally mentions a nickel tungsten oxide turning from a transparent state to a brown colored state. However, U.S. Patent Publication No. 2009323157 A1 is silent on the chemical composition of the "nickel tungsten oxide".

U.S. Patent Publication No. 20140002884 A1 discloses an electrochromic material chosen among hydrated metal oxides, preferably amorphous, such as hydrated tungsten oxide $H_xWO_3.nH_2O$, where x is between 0 and 1 and n is an integer of 1 to 2, and mixtures of two or more of these oxides. However, U.S. Patent Publication No. 20140002884 A1 is silent on providing a material with a neutral color at colored and bleached states.

U.S. Patent Publication No. 20140043666 A1 discloses an electrochromic material selected from the group consisting of $Li_{1.82}NiW_{0.45}O_x$; $Li_{1.97}NiZr_{0.23}O_x$; $Li_{0.51}NiZr_{0.16}La_{0.19}O_x$; $Li_{2.22}NiZr_{0.14}Mo_{0.25}O_x$; $Li_{3.12}NiZr_{0.15}Ta_{0.15}O_x$; and $Li_{2.65}NiZr_{0.18}V_{0.60}O_x$, where x ranges from approximately 0.1 to approximately 50, from approximately 1 to approximately 6 or from approximately 1.6 to approximately 5.4, which it is proposed to be combined with dark blue electrochromic tungsten oxide, to yield a more neutral grey dark state for the overall electrochromic coating. However, U.S. Patent Publication No. 20090323157 A1 is silent on chemical composition of the "tungsten oxide". Moreover, the document states that one sample exhibited a repeatable bleaching time of approximately 11 seconds, and a coloration time of approximately 11 seconds with corresponding bleached and dark state for light transmission at 670 nm of 98/50%, another sample exhibited corresponding values of approximately 25 seconds, approximately 12 seconds, and approximately 94/26%, so the electrochromic material of U.S. Patent Publication No. 20090323157 A1 is rather slow.

U.S. Patent Publication No. 20170003564 A1 discloses electrochromic materials, which may be binary metal oxides (e.g., oxides that include two metals in addition to lithium or other transported ion, NiWO being one example), ternary metal oxides (e.g., oxides that include three metals, NiWTaO being one example), or even more complex materials. It is generally stated that they are doped or otherwise combined with one or more additional elements. The additional element(s) may include at least one a non-alkali metal in various cases. The electrochromic materials may comprise one or more additional element selected from the group consisting of: silver (Ag), aluminum (Al), arsenic (As), gold (Ag), barium (Ba), beryllium (Be), bismuth (Bi), calcium (Ca), cadmium (Cd), cerium (Ce), cobalt (Co), chromium (Cr), copper (Cu), europium (Eu), iron (Fe), gallium (Ga), gadolinium (Gd), germanium (Ge), hafnium (Hf), mercury (Hg), indium (In), iridium (Ir), lanthanum (La), magnesium (Mg), manganese (Mn), molybdenum (Mo), niobium (Nb), neodymium (Nd), osmium (Os), protactinium (Pa), lead (Pb), palladium (Pd), praseodymium (Pr), promethium (Pm), polonium (Po), platinum (Pt), radium (Ra), rhenium (Re), rhodium (Rh), ruthenium (Ru), antimony (Sb), scandium (Sc), selenium (Se), silicon (Si), samarium (Sm), tin (Sn), strontium (Sr), tantalum (Ta), terbium (Tb), technetium (Tc), tellurium (Te), thorium (Th), titanium (Ti), thallium (Tl), uranium (U), vanadium (V), tungsten (W), yttrium (Y), zinc (Zn), zirconium (Zr), and combinations thereof. In certain embodiments, the additional element(s) may include at least one element selected from the group consisting of tantalum, tin, niobium, zirconium, silicon, aluminum, and combinations thereof. In particular, it discloses a material of $Li_aNiW_xA_yO_z$, where: a is 1 to 10; x is 0 to 1; y is 0 to 1; and z is at least 1; and wherein a, x, y, z, and A are selected independently for each of the first and second sublayers of the counter electrode layer, and NiWTaO including approximately 7% or 14% tantalum. However, U.S. Patent Publication No. 20170003564 A1 is silent on providing a material with a neutral color at colored and bleached states.

U.S. Patent Publication No. 20170329200 A1 discloses an electrochromic material containing any one or more of a number of metal oxides including tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. The metal oxide may be doped with one or more dopants such as lithium, sodium, potassium, molybdenum, niobium, vanadium, titanium, and/or other suitable metals or compounds containing metals. Mixed oxides (for example, W—Mo oxide, W—V oxide) also may be used so the electrochromic layer may include two or more of the aforementioned metal oxides. However, U.S. Patent Publication No. 2017329200 A1 is silent on providing a neutral color at colored and bleached states.

U.S. Pat. No. 6,266,177 B1 discloses technology of producing electrochromic materials like $Cu_{0.064}W_{0.93}O_y$, $K_{0.1}W_{0.9}O_y$, $Na_{0.1}W_{0.9}O_y$, $Li_{0.1}W_{0.9}O_y$, $Ba_{0.1}WO_{0.9}O_y$, $(Li_{0.1}Cr_{0.1}W_{0.8})O_y$, $(Li_{0.1}Co_{0.1}W_{0.8})O_y$. However, U.S. Pat. No. 6,266,177 B1 is silent on providing a neutral color at colored and bleached states.

Patent documents WO2011028253 A2, WO2011028254 A2 disclose an approach to providing electrochromic material having improved color properties. In terms of color/hue, certain embodiments may reduce the yellowish hue in the clear state and the multiple colors that sometimes are present in the tinted state by ensuring delta E, which may be less than approximately 1.5 eV, more preferably less than approximately 1.25 eV, and still more preferably less than approximately 1 eV, while value of x preferably is 2.4<x<3; more preferably 2.6<x<3 in sub-stoichiometric $WO_x$, instead providing a more neutral color in the clear state with a choice from one of multiple colors in the tinted state.

Patent documents WO2011137080 A1, WO2011137104 A1 and WO2012177790 A2 disclose an electrochromic material $WO_{3-y}$ ($0<y\leq0.3$) and nickel-tungsten oxide (NiWO) counter-electrode with tantalum dopant to provide a neutral color at bleached state. However, WO2011137080 A1 is silent on providing a neutral color at colored state.

Patent document WO2013013135 A1 discloses, inter alia, an electrochromic material $Li_xNi(II)_{(1-y)}Ni(III)_{(y)}W_zO_{(i+0.5x+0.5y+3z)}$. However, WO2013013135 A1 is silent on providing a neutral color at colored and bleached states.

Patent documents WO2014113796 A1 and WO2014113801 A1 disclose a lithium tungsten nickel oxide film as an electrochromic material. However, WO2014113796 A1 is silent on providing a neutral color of the material at colored and bleached states.

Patent document WO2014143410 A1 discloses an electrochromic material having an atomic ratio of amount of lithium to combined amount of nickel and tungsten (i.e., Li:[Ni+W]) or combined amount of nickel, molybdenum and tungsten (i.e., Li:[Ni+Mo+W]) in the electrochromic layer is generally at least approximately 0.4:1, 0.75:1, 0.9:1 and generally less than 1.75:1. The document also discloses an electrochromic material having an atomic ratio of the combined amount of molybdenum and tungsten to the combined amount of nickel, molybdenum and tungsten (i.e., [Mo+W]:[Ni+Mo+W]) is greater than approximately 0.8:1, 0.7:1, 0.6:1 or 0.5:1. The document also discloses an electrochromic material having an atomic ratio of the combined amount of molybdenum, tungsten and bleached state stabilizing element(s) M to the combined amount of nickel, molybdenum, tungsten and bleached state stabilizing elements M in the electrochromic lithium nickel oxide material (i.e., [Mo+W+M]:[Ni+Mo+W+M]), where M is Y, Ti, Zr, Hf, V, Nb, Ta, B, Al, Ga, In, Si, Ge, Sn, P, Sb or a combination thereof) is less than approximately 0.8:1, 0.7:1, 0.6:1 or 0.5:1 but greater than approximately 0.075:1. However, WO2014143410 A1 is silent on providing a neutral color of the material at colored and bleached states.

Patent document WO2017034847 A1 discloses an electrochromic material in a form of cubic or hexagonal cesium doped tungsten oxide nanoparticles having improved color properties, in particular, $Cs_xWO_3$ (where 0.2<x<0.4), $Cs_1WO_{6-\sigma}$ (where $0<\sigma<0.3$), $NbO_x$, $TiO_2$, $MoO_3$, $NiO_2$, $V_2O_5$ or combinations thereof. For example, to produce a blue color, the electrochromic material may include approximately 100 wt. % of $WO_3$ as the first nanostructures and may omit the second nano structures; to produce a green color, the electrochromic material may include approximately 60 wt. % of $Cs_{0.29}WO_3$, hexagonal crystal lattice structure nanocrystals, and approximately 40 wt. % of indium tin oxide (e.g., $Sn:In_2O_3$) nanocrystals; to produce a brown color, the electrochromic material may include approximately 100 wt. % $NbO_x$ nanoparticles (e.g., $Nb_2O_{5-\sigma}$ where $0<\sigma<0.1$) as the first nanostructures and may omit the second nanostructures; to produce a purple color, the electrochromic material may include approximately 100 wt. % $Nb:TiO_2$ nanocrystals as the first nanostructures and may omit the second nanostructures; to produce a neutral gray color, the first nanostructures may include amorphous niobium oxide nanoparticles (e.g., $Nb_2O_{5-\sigma}$, where $0<\sigma<0.1$), and the second nano structures may include cesium doped tungsten oxide nanoparticles having a cubic crystal lattice structure (e.g., $CsW_2O_{6-\sigma}$ nanocrystals, where $0<\sigma<0.3$).

Patent document WO2017136243 A1 proposes using 5-10 wt % of amorphous nanostructured materials like $NbO_x$ for color balancing to the visible light absorption in electrochromic materials due to the polaron-type shift in the spectral absorption of the doped-transition metal oxide bronze like $Cs_1W_2O_{6-x}$, where $0<x<0.1$.

Patent document WO2017165834 A1 discloses an electrochromic material that is made substantially of $WO_x$, where x is between approximately 2.7 and 3.5. However, WO2017165834 A1 is silent on providing a material of a neutral color at colored and bleached states.

Non-patent document [18] discloses intercalation and conversion processes related to atoms of Li, Na and Ca in a crystal lattice of $WO_3$, used in electrochemical elements and electrochromic devices.

Non-patent document [19] discloses an effect of lithium concentration in amorphous $WO_3$ on optical properties of tungsten oxide-based films.

Non-patent document [20] discloses an effect of lithium concentration in amorphous $WO_3$ on spectral dependence of transmission factor and reflection factor of tungsten oxide-based films.

Non-patent document [21] discloses a lithium intercalation process related to different electrolytes in electrochromic materials based on tungsten and nickel oxides.

Non-patent document [22] discloses an effect of lithium concentration in $WO_3$ on spectral dependence of optical properties.

Non-patent document [23] discloses an effect of nitrogen doping on electrochromic properties of $WO_3$.

Non-patent document [24] discloses an effect of $WO_3$ reduction degree on electrochromic properties of $WO_3$.

Non-patent document [25] discloses an effect of lattice structure type of $WO_3$ on electrochromic properties of $WO_3$. A possibility of doping $WO_3$ with titanium is indicated.

Non-patent document [26] discloses different aspects of providing combined electrochromic/storage devices based on $WO_3$.

Non-patent document [27] discloses an effect of doping $WO_3$ with molybdenum on spectral dependence of optical properties of $WO_3$.

Non-patent document [28] discloses an effect of $WO_3$ reduction degree on electrochromic properties of $WO_3$.

Non-patent document [29] discloses an effect of annealing on optical properties of tungsten oxide with stoichiometric content of $W_{18}O_{49}$ compared to ordinary tungsten oxide $WO_3$.

Conventional electrochromic materials obtained according to known technology have a fixed tint color, mostly blue, which may be uncomfortable for some users and even inapplicable in some cases, e.g., due to safety reasons. Fixed color means here that the prior art technology is mostly unable to provide any selection of available colors during production. Further, conventional electrochromic materials have a limited lifetime. Moreover, conventional electrochromic materials have a long transitional time when changing from colored to transparent state and back.

Accordingly, there is a need in the art for relatively cheap electrochromic materials and technology for industrial and/or domestic application, which would provide extended tint color range, including optically neutral colors like gray or brown, improved lifetime, and shortened transitional time. Preferably, such materials would be also structurally and technologically compatible with photovoltaic devices, like solar batteries and with energy storing devices, like lithium batteries or supercapacitors. This compatibility would allow using a common manufacturing technology and providing combined devices like smart glasses having controllable transparency and capable of producing and storing electrical energy.

SUMMARY OF THE INVENTION

Magnetron sputtering and co-sputtering for producing EC materials may be performed by PDC method in several ways: (1) directly from carbide-based material targets such as WC, MoC, CrC, SiC, VC, $Ni_3C$, $Co_2C$, $NbC-Nb_2C$, TaC, SiC, $Mn_5C_2$, etc.; (2) from relevant transition metals W, Mo, Cr, Al, Ti, Zr, Nb, Ni, V, Ta, Mn and graphite-based material target as well as non-metal elements such as Si, Ge, P, B, etc.; (3) directly from composite targets (fine powder mixture of transition metals, non-metal elements and graphite powder). Sputtering may be performed instantly from 1 to 4 targets in each case.

The proposed sputtering method allows for obtaining EC materials with increased electronic and ionic conductivity, higher coloration and good cycling (lifetime). Moreover, the inventors have obtained other tints of blue as well as gray, black and brown colors neutral to the eye.

The proposed technology provides an electrochromic material having a formula $WO_{2.4-2.9}$:M1:M2:E1:E2:E3, where M1 is a dopant selected from Mo, Ti, Ni, Zr, V, Cr, Al, Nb, Ta, Co, Mn; M2 is an optional dopant selected from Mo, Ti, Ni, Zr, V, Cr, Al, Nb, Ta, Co, Mn; here, E1 is a dopant selected from H, N, C, Si, Ge, P, B; E2 is a dopant selected from H, N, C, Si, Ge, P, B; E3 is an optional dopant selected from H, N, C, Si, Ge, P, B; M1≠M2, E1≠E2≠E3.

In particular, the electrochromic material may be $M(I)_{0.1-3.0}WO_{2.4-2.9}$:M1:M2:E1:E2:E3, where M(I) is selected from group 1 elements: $Li^+$, $Na^+$, $K^+$; it may be $M(II)_{0.1-1.5}WO_{2.4-2.9}$:M1:M2:E1:E2:E3, wherein M(II) is selected from group 2 elements: $Mg^{2+}$, $Ca^{2+}$, $Ba^{2+}$, $Zn^{2+}$; it may also be $M(III)_{0.1-1.0}WO_{2.4-2.9}$:M1:M2:E1:E2:E3, wherein M(III) is selected from group 3 elements: $Sc^{3+}$, $Y^{3+}$, $La^{3+}$ and other lanthanides i.e., $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$.

For co-sputtering, a combination of gas mixtures may be used: $Ar/O_2/N_2$, $Ar/H_2/N_2/O_2$, $Ar/NH_3/O_2$, $Ar/CO/N_2/O_2$, $Ar/CO/H_2/N_2/O_2$, $Ar/CH_4/N_2/O_2$ and $Ar/NH_3/CO/N_2/O_2$. The pressure of the gas mixture may be between approximately 5 millitorr and approximately 15 millitorr, and the gas mixture flow may be between approximately 80 sccm (standard cubic centimeters per minute) and approximately 100 sccm.

Further, the EC material may be pre-intercalated with $Li^+$, $Na^+$ or $K^+$. Alternatively, the EC material may be pre-intercalated with $Mg^{2+}$, $Ca^{2+}$, $Ba^{2+}$ or $Zn^{2+}$. Still alternatively, the EC material may be pre-intercalated with $Sc^{3+}$, $Y^{3+}$, $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$. Pre-intercalation may be performed in a liquid cell using absolutized organic or inorganic electrolytes in argon atmosphere.

Further processing depends on the above pre-intercalation options. If the EC material was not pre-intercalated, it undergoes post-annealing at a temperature between approximately 450° C. and approximately 550° C. No deintercalation needs to be performed in this case.

If the EC material was pre-intercalated with $Li^+$, $Na^+$ or $K^+$, it is thermo-split by post-annealing at a temperature between approximately 250° C. and approximately 450° C. and further deintercalated under negative polarity in a liquid cell ions at approximately room temperature (in the case of using $Na^+$ or $K^+$ ions for pre-intercalation). The deintercalation procedure is not necessary to perform when using $Li^+$ ions.

If the EC material was pre-intercalated with $Mg^{2+}$, $Ca^{2+}$, $Ba^{2+}$ or $Zn^{2+}$, it is thermo-split by post-annealing at a temperature between approximately 250° C. and approximately 450° C. and further deintercalated under negative polarity in a liquid cell at approximately room temperature.

If the EC material was pre-intercalated with $Sc^{3+}$, $Y^{3+}$, $Ln^{3+}$ (lanthanides), it is thermo-split by post-annealing at a temperature between approximately 100° C. and approximately 250° C. and further deintercalated under negative polarity in a liquid cell at approximately room temperature.

When the EC material was pre-intercalated with large atoms (e.g., $Zn^{2+}$, $Ca^{2+}$, $Y^{3+}$, etc.), splitting (i.e., forming vertical nano-channels facilitating movements of $Li^+$ ions during operation of the EC material) may take place at a lower temperature, sometimes even at room temperature. The more pre-intercalated atom radius, the lower the splitting temperature may be.

Post-annealing allows for fast switching and deep coloring/decoloring EC material having stable electrochemical characteristics and a long lifetime.

The EC material obtained by the above method is at least partially a crystalline material. It may be used as a cathode material or as an anode material, depending on configuration of the EC device layer stack.

As a result, the inventors have obtained a tungsten oxide EC material ($WO_{2.4-2.9}$:M1:M2:E1:E2:E3) heavily doped with metals M1, M2=Mo, Ti, Ni, Zr, V, Cr, Al, Nb, Ta, Co, Mn, and nonmetals E1, E2, E3=H, N, C, Si, Ge, P, B. The main element in each case is W with a concentration of tungsten oxide in the final deposited film of more than approximately 50% towards dopant concentration.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding the invention and are incorporated in and constitute a part of this specification and together with the description serve to explain the principles of the invention.

DETAILED DESCRIPTION OF EMBODIMENTS OF THE INVENTION

Figure 1:
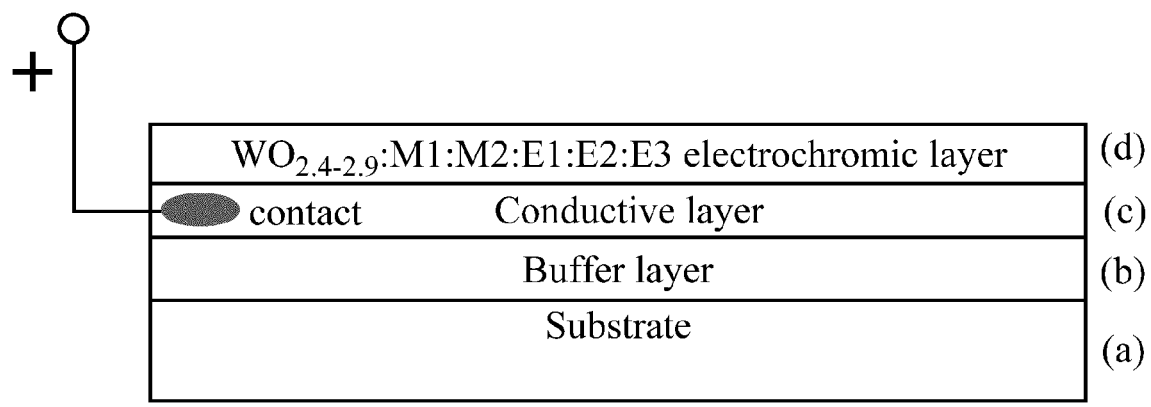
FIG. 1 illustrates an electrochromic stack.

Reference will now be made in detail to the preferred embodiments of the present invention, examples of which are illustrated in the accompanying drawings.

Electrochromic (EC) materials were developed, based on the heavily doped tungsten oxide $WO_{2.4-2.9}$:M1:M2:E1:E2:E3 (where M1, M2=Mo, Ti, Ni, V, Cr, Al, Nb, Ta, Co, Mn; E1, E2, E3=H, N, C, Si, Ge, P, B). When these materials are cathode materials intercalated with metal ions, they are not only intensively colored in various tints of blue (cold blue, violet, gray blue, etc.), but in some cases the new materials are colored in such "neutral" colors as gray, black and brown. Transparency of the obtained materials ranges from T≥76% in the bleached state to T≤0.3% in the colored state and surpasses many existing commercial products. In some cases at full coloring in the samples, the films may be completely non-transparent in the visible light range.

Doping the $WO_x$ host material was performed either by magnetron reactive co-sputtering metals and carbide materials or by reactive co-sputtering metals and graphite. Use of carbide materials as targets or co-sputtering metal and graphite is an important condition for obtaining EC materials $WO_{2.4-2.9}$:M1:M2:E1:E2:E3 with advanced characteristics.

The obtained materials were post-annealed at a comparatively high temperature (450-550° C.). Accordingly, the materials were crystalline. Different publications often show diametrically opposed opinions on effectiveness of amorphous and crystalline EC materials based on tungsten oxide. The inventors studied many samples of doped materials $WO_{2.4-2.9}$:M1:M2:E1:E2:E3 and conclude that crystalline structures are far more effective and stable when used as EC layers. The highest temperature of post-annealing EC sputtered materials known from open sources usually does not exceed 350-360° C., see [17], while a much higher temperature (up to 800° C.) is usually used in sol-gel technology during sintering small particles for EC layer formation.

EC films obtained by this method possess increased electron conductivity and a more porous structure. It facilitates intercalation and de-intercalation of positive ions ($H^+$, $Li^+$, $Na^+$, $K^+$, $Ca^{2+}$, $Mg^{2+}$, $Zn^{2+}$, $Y^{3+}$, $Sc^{3+}$, $La^{3+}$, etc.) avoiding destruction of the EC coating. In addition, the proposed approach allows for application of quite thick EC layers (up to 10 μm) while maintaining an acceptable speed of coloring and bleaching. Consequently, it allows achieving more intense coloring in depth of EC coatings. This is especially important in cases when the necessary depth of color or tint may not be achieved by another method. In other words, when intensity of the color of the material itself is low, a desired grade of transmittance (T) in the colored state in the visible range may be achieved owing to larger thickness of the coating [30].

Depending on a value of electrochemical potential of the counter electrode used in the cell, the $WO_{2.4-2.9}$:M1:M2:E1:E2:E3 materials obtained by the inventors may be used as either cathode or anode EC material. When the counter electrode is made of a metal foil or a graphite-based material or some oxide-based material or phosphate-based material like $Li_4Ti_5O_{12}$, $CeO_2$, $LiMnO_2$, $Nb_2O_5$, $TiO_2$, $LiFePO_4$, etc., all having a rather low electrochemical potential (usually less than 3.3-3.5V compared to $Li/Li^+$), the $WO_{2.4-2.9}$:M1:M2:E1:E2:E3 materials may be used as cathode EC materials. In other words, when the cell containing the cathode EC material is discharged (does not have any stored charge), the EC layer is completely intercalated (e.g., by $Li^+$ ions) and is in the colored state. Thus, power is not consumed for maintaining the EC material in the colored state in this kind of configuration. This option allows saving energy, if the EC material mostly has to be in the colored state. For example, it may be advantageous when the EC material is used for providing facade glazing operable under high insolation conditions. In this case, the EC material may be powered down for most of time and still assure defending inner space against solar irradiation, and it may be powered up for a short time when the glazing needs to be in the colorless state.

When the counter electrode is made of a material having a high electrochemical potential (usually more than 3.3-3.5V compared to $Li/Li^+$) like $V_2O_5$, $LiCoO_2$, $LiNiO_2$, $LiNiCoO_2$, etc., the $WO_{2.4-2.9}$:M1:M2:E1:E2:E3 materials may be used as anode EC materials. In other words, when the cell containing the anode EC material is discharged (does not have any stored charge), the EC layer is completely deintercalated and is in the colorless state. Thus, power is not consumed for maintaining the EC material in the colorless state in this kind of configuration. This option allows saving energy, if the EC material mostly has to be in the colorless state. It may be advantageous when the EC material is used for applications requiring to pass as much sun or other light as possible for most of time, for example, in home interior solutions or in car dimmable glass.

In addition, films of EC materials $WO_{2.4-2.9}$:M1:M2:E1:E2:E3 obtained by co-sputtering carbides and co-sputtering with graphite may be used for electrodes with advanced properties for electrochemical power sources like batteries and supercapacitors (pseudocapacitors or hybrid capacitors), see [31]. These materials are more promising if compared to existing conventional cathode materials based on cobalt, nickel and manganese oxides, as their real capacity for Li/Li$^+$ may be much higher, lifetime many times longer, and operating temperature range quite wide (−50 . . . +150° C.). This greatly expands the range of applications of such power sources.

Materials

Figure 2A:
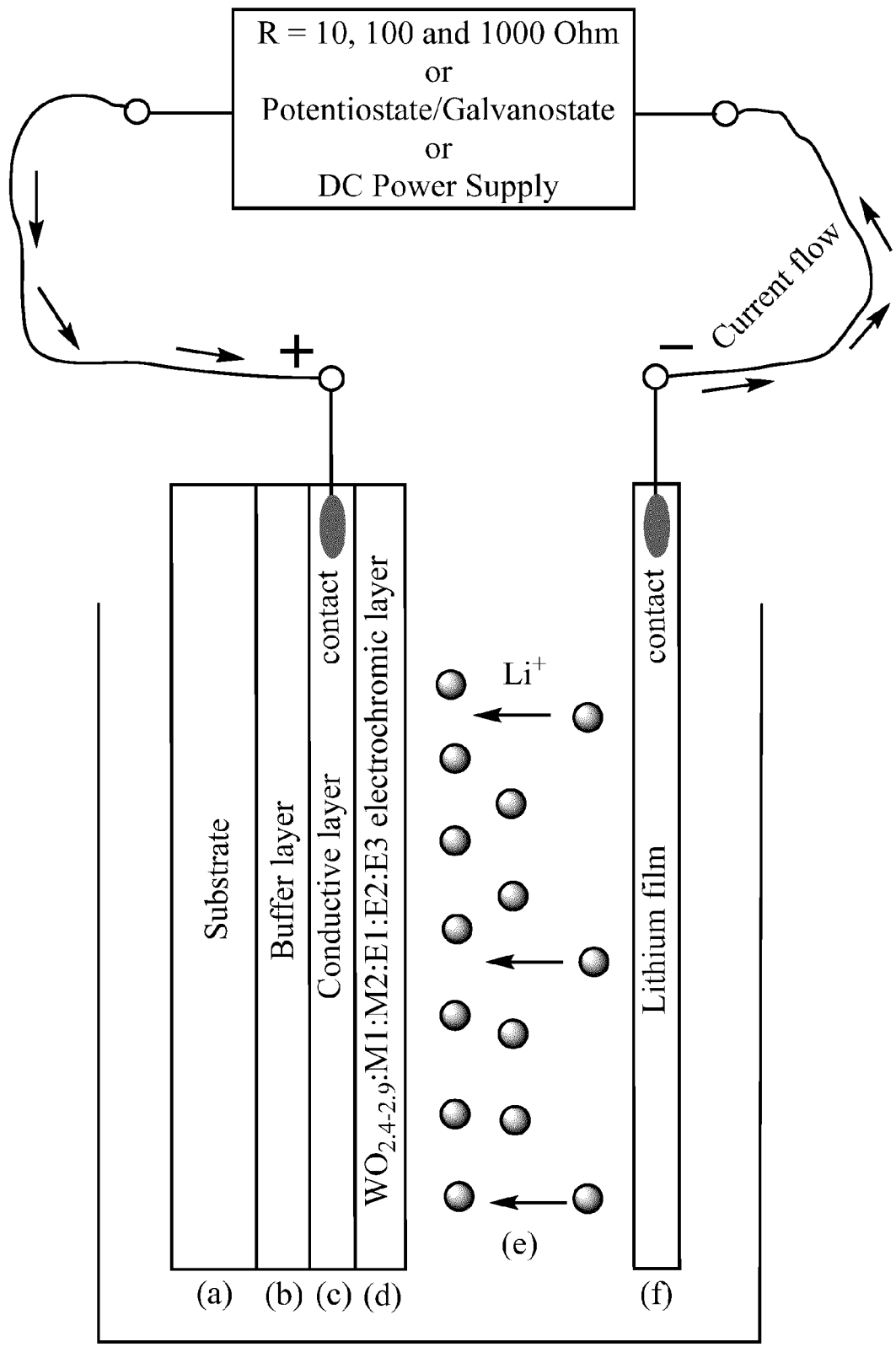
FIG. 2A and FIG. 2B illustrate "wet" cells to perform lithium intercalation (FIG. 2A) and deintercalation (FIG. 2B) for optical measurements.
Figure 2B:
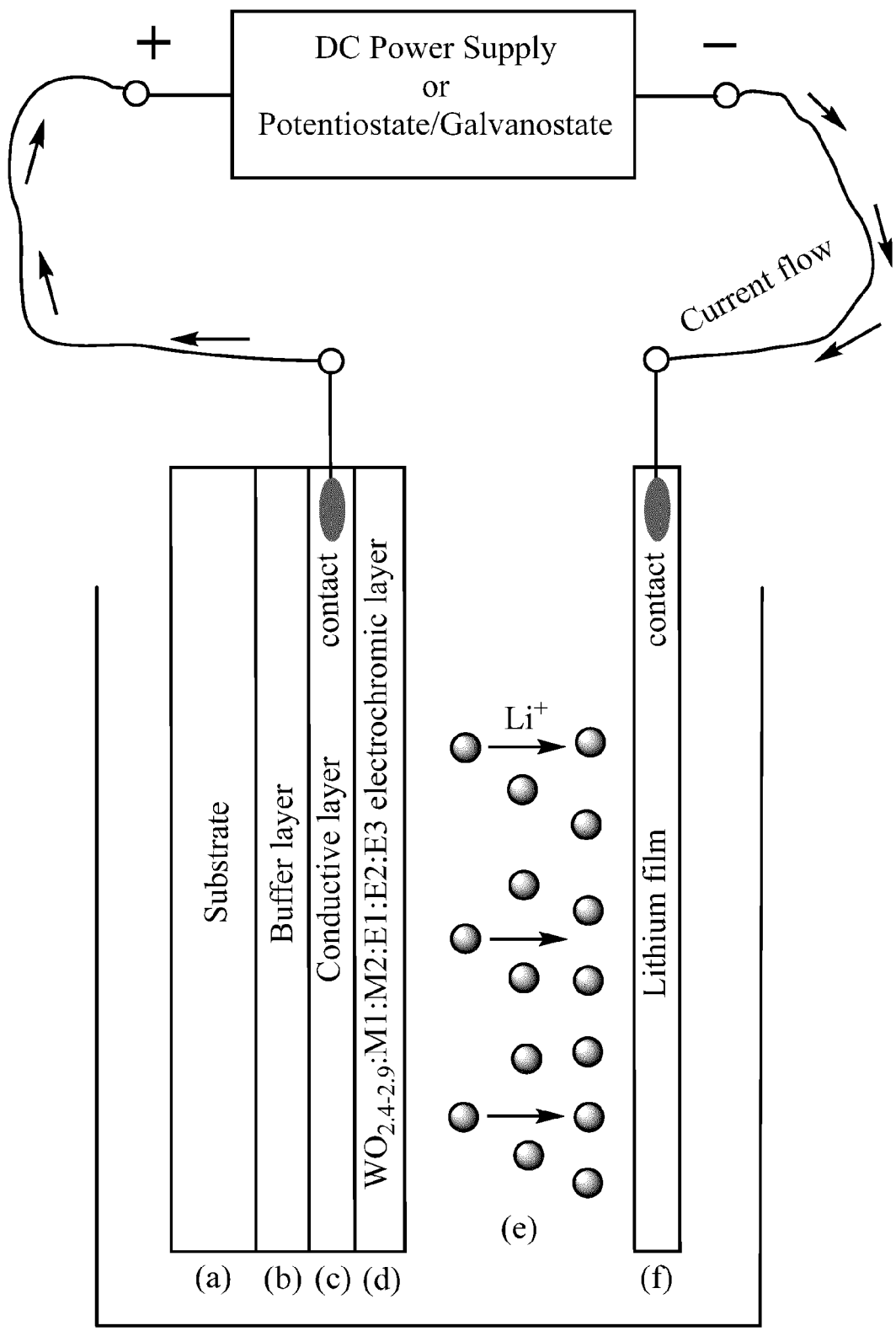

Magnetron sputtering of all materials was performed on rigid and flexible substrates (a) (FIG. 1). The buffer layer (b) may be sputtered before conductive layer (c). The following combinations of (a), (b) and (c) may be used: (glass or ceramic)/SiO$_2$/ITO, glass/SiC$_x$O$_y$/FTO, (PET or PEN)/SiO$_2$/ITO films (in some cases at relatively low temperatures) or any other transparent substrates for the transparent electrode assembly as well as non-transparent or mirror electrodes such as (glass or ceramic)/M, KAPTON/SiO$_2$/ITO, KAPTON/M, (PEN or PET)/M (M=Al, Ti, Mo, Cr, NiCr or any suitable reflective metal) to perform optical and electrochemical measurements in a liquid cell (FIG. 2A, FIG. 2B). Thickness of the substrate may also vary. The thickness is usually 20 to 250 μm for flexible polymer films or some thin flexible ceramics and 0.45 to 4 mm for glass, ceramics and other rigid substrates. Buffer layer (b) in some substrates is necessary to apply and its thickness ranges from 50 to 200 nm. Electron-type conductive layer (c) has a thickness of approximately 150-250 nm for ITO, 600-900 nm for FTO and 250-350 nm for metal conductors. Commercially available and tailored substrates with conductive layers may be used.

EC materials (d) were synthesized by magnetron co-sputtering several different targets and simultaneous depositing. A wide range of doping elements in the host $WO_x$ matrix was made available by changing the magnetron gun's power. This helped to make a number of EC materials with promising coloring and electrochemical characteristics.

Manufacturing Method A

Co-sputtering from 2 targets was employed. One target was W or WC and the second one was MC$_{carbide}$-MoC, CrC, SiC, VC, Ni$_3$C, Co$_2$C, NbC-Nb$_2$C, TaC, SiC, Mn$_5$C$_2$, etc., as well as non-metal carbides like EC=SiC or composite targets M(or E)C$_{composite}$ (M=Al, Nb, V, Ti, Ta, Co, Mn, NiV7; E=Si, Ge, P, B; C=graphite). The composite targets may be used, when the carbide materials are unavailable, or just to decrease the cost of materials.

Target combinations: W(WC)-M1(E1)C$_{carbide}$ and W(WC)-M1(E1)C$_{composite}$.

Gas mixtures: Ar/O$_2$/N$_2$, Ar/H$_2$/N$_2$/O$_2$, Ar/NH$_3$/O$_2$, Ar/CO/N$_2$/O$_2$, Ar/CO/H$_2$/N$_2$/O$_2$, Ar/CH$_4$/N$_2$/O$_2$ and Ar/NH$_3$/CO/N$_2$/O$_2$.

Post-annealing: Slow annealing in a muffle oven or rapid temperature annealing (RTA) both in air atmosphere at 450-550° C. was performed.

By this method such materials as $WO_{2.6-2.9}$:E1:E2:E3 and $WO_{2.6-2.9}$:M1:E1:E2:E3 (M1=Ti, NiV7, V, Cr, Al, Nb, Ta, Co, Mn; E1, E2, E3=H, N, C, Si, Ge, P, B) were synthesized.

Presence of M1 and E1, E2, E3 made the tungsten oxide matrix more crystalline and provided a greater surface area. The presence of nano-sized vertical channels in EC film improved M(I, II, III)$^{n+}$ ions penetration depth. As a result, almost whole volume of $WO_x$-based material became accessible for interaction with M(I, II, III) ions. The dopant presence also enhanced electron conductivity of the material. That is why the coloring in the EC layer was faster and its intensity was higher in comparison with pure $WO_3$, oxygen depleted $WO_{2.4-2.9}$ and even some well-known doped $WO_x$-based materials, as well as nitrogen doped tungsten oxide (WNO) [14].

Manufacturing Method B

Co-sputtering from 3 targets was employed.

Target combinations: W-M1(E1)C$_{carbide}$-M2 and W-M1 (E1)C$_{composite}$-M2.

Gas mixtures: Ar/O$_2$/N$_2$, Ar/H$_2$/N$_2$/O$_2$, Ar/NH$_3$/O$_2$, Ar/CO/N$_2$/O$_2$, Ar/CO/H$_2$/N$_2$/O$_2$, Ar/CH$_4$/N$_2$/O$_2$ and Ar/NH$_3$/CO/N$_2$/O$_2$.

Post-annealing: Slow annealing in a muffle oven or rapid temperature annealing (RTA) both in air atmosphere at 450-550° C. was performed.

By this method, such materials as $WO_3$:M1:M2:E1:E2:E3 (M1, M2=Ti, NiV7, V, Cr, Al, Nb, Ta, Co, Mn; E1, E2, E3=H, N, C, Si, Ge, P, B) were synthesized. A presence of M1, M2 and E1, E2, E3 dopants (such as in method A) made the tungsten oxide film more conductive for M(I, II, III) ions and electrons. In addition, combination of dopants with oxidation states 3$^+$, 4$^+$ and 5$^+$ in the tungsten oxide matrix helped suppressing "deep trap" ions intercalation during the coloring process, see [31]. As a result, almost the entire volume of the material became available for interaction with M(I, II, III) ions, and this reaction was fully reversible. Coloring such EC layer was faster and color intensity was much higher.

Manufacturing Method C

Co-sputtering from 4 targets was employed.

Target combinations: W-M1(E1)-M2-C$_{graphite}$

Gas mixtures: Ar/O$_2$/N$_2$, Ar/H$_2$/N$_2$/O$_2$, Ar/NH$_3$/O$_2$, Ar/CO/N$_2$/O$_2$, Ar/CO/H$_2$/N$_2$/O$_2$, Ar/CH$_4$/ N$_2$/O$_2$ and Ar/NH$_3$/CO/N$_2$/O$_2$.

By this method the same materials were synthesized as in method B, but instead of using carbides or graphite composites, co-sputtering with separated graphite targets was used to get approximately the same results. This method was more complicated in view of co-sputtering from 4 targets simultaneously, however, the process can be made cheaper and more flexible. For example, it was not necessary to make expensive and complicated composite targets or targets of refractory carbides.

Optical Measurements

For identifying color intensity, coloring dynamics and color coordinates of EC materials, liquid cells or semi-cells placed in vessels (cuvettes) made from PMMA or silica glass were used (FIG. 2A, FIG. 2B).

Figure 3:
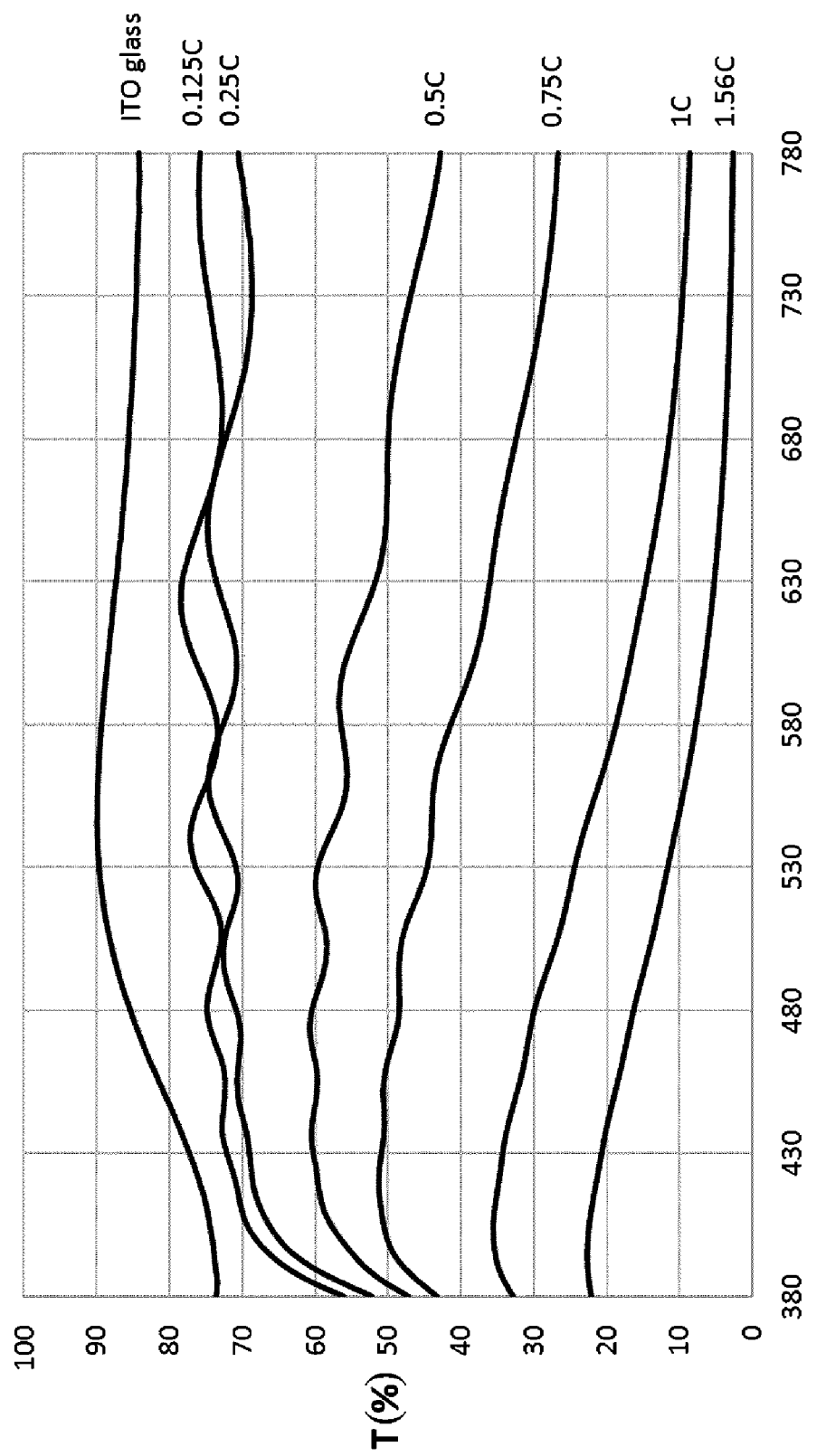
FIG. 3 illustrates dependence of optical transmittance (T) of EC layer on degree of $Li^+$ intercalation, where 1C is an average fast reversible capacity (approximately 13 mAh/g) of galvanic cells with variety of heavily doped EC materials used as cathode. The transmittance drops down under increase of intercalated $Li^+$ ions in $WO_x$-based materials.
Figure 4:
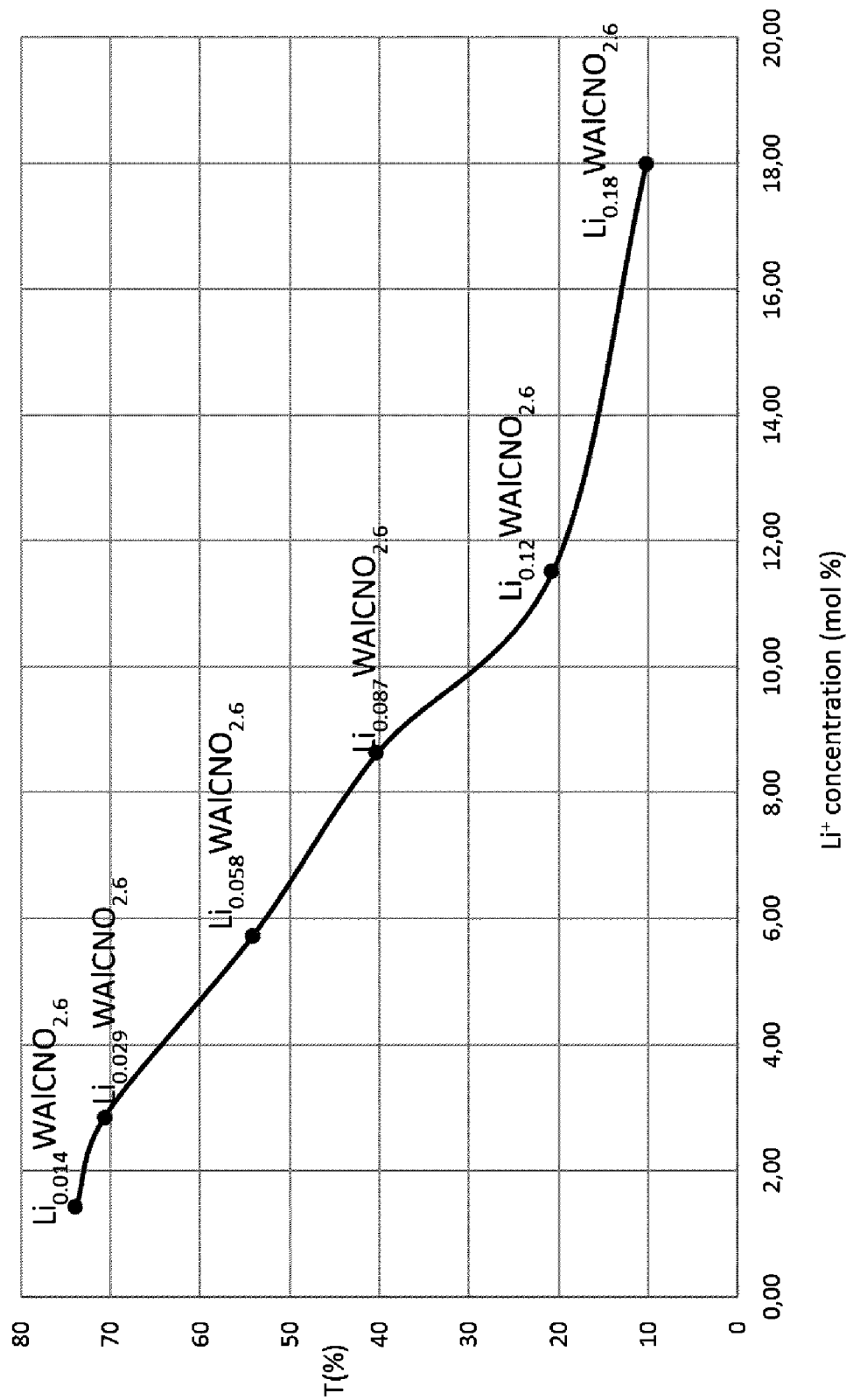
FIG. 4 illustrates dependence of transmittance of an EC doped tungsten oxide $Li_xWAlCNO_{2.9}$ (WAlCON) material in a visible range on degree of $Li^+$ concentration in the intercalated material.

A sample of an EC film (d) on a substrate (a)-(c) was placed into a solution of 1M LiClO$_4$ or LiPF$_6$ in purified propylene carbonate (PC). This cell included cathode (d), electrolyte (e) and anode (f), and, consequently formed a galvanic cell (a battery). Therefore, for coloring a cathode material (ion intercalation) one may use either discharge of a galvanic cell for a fixed load (e.g., R=10, 100 or 1000 Ohms), or application of reverse voltage of a DC power supply, as well as use a potentiostat/galvanostat. Foils made of Li, Na, K, Mg, Ca, Zn, Sc, Y, La, etc. may be used as the anode (f) metal. Lithium metal, calcium, magnesium and zinc were mostly used. OCV value of 3.2-3.4 V was obtained when lithium was used as anode. Coloring time was monitored by the discharge curves of the cells $WO_{2.4-2.9}$:M1:M2:E1:E2:E3|PC+LiClO$_4$|Li. Discharge of a liquid cell of 6-10% was considered the maximum fast reversible coloring state. To build a transmittance change curve, the points corresponding to different degrees of the discharge were taken (FIG. 3). Furthermore, the EC sample, e.g., a cathode material on a substrate Si/SiO$_2$/Ti/WO$_{2.4-2.9}$: M1:M2:E1:E2:E3, which was discharged to the necessary condition, was taken out of the cell and washed with organic absolute aprotic solvents. Then the reflectivity (transmittance) along with color coordinates CIE L*a*b* of the EC layer were measured. Almost all operations were conducted in a dry gas or inert gas atmosphere.

Other Methods of EC Film Modification to Achieve Higher Performance

Highly satisfactory results in synthesis of new materials of $WO_{2.4-2.9}$:M1:M2:E1:E2:E3 type were achieved by using reactive magnetron sputtering method from carbide and graphite containing targets. This approach allowed obtaining EC materials with improved porosity, increased number of channels for metal ion diffusion and improved ion conductivity. Additionally, greater enhancement of performance characteristics of the materials specified above was achieved, including significantly increasing surface area and porosity of the material, and also increasing its lifetime due to use of pre-intercalation and "splitting" of pre-intercalated samples of EC films.

Method I. Surface Modification by M(I) Ions Pre-Intercalation and Post-Annealing Substrates: Si/SiO$_2$/M (M=Ti, Mo, Cr, NiCr or stainless steel), Glass/SiO$_2$/ITO or Glass/SiC$_x$O$_y$/FTO or similar.

Source materials: $WO_{2.4-2.9}$:M1:M2:E1:E2:E3, as described above.

Original samples were pre-intercalated with monovalent metal ions (Li$^+$, Na$^+$ and K$^+$) using a potentiostat/galvanostat by ⅛, ¼, ½, ¾ and 1C of maximum (irreversible) capacity of EC material. For intercalation, the same cells with a liquid electrolyte as shown at FIG. 2A were used. In addition, crystallites of the same chemical composition as original amorphous pre-intercalated material, M(I)$_{0.1-0.65}$WO$_{2.4-2.9}$: M1:M2:E1:E2:E3, were formed.

The resulting samples were post-annealed in argon atmosphere at +250 . . . +450° C. During that, the EC film partially "split" and vertical channels of almost regular shape were formed. Diameter of the channels was approximately 30 nm.

Modified by such methods, the material may alternate between bleached and colored state 5-10 times faster than a non-modified material. It may be important in some applications, where the switching speed is important (e.g., in displays, rear mirrors, dynamic optics).

Method II. Surface Modification by M(II, III) Ions Pre-Intercalation With and Without Post-Annealing In addition to monovalent metal ions for pre-intercalation, two- or three-valence metal ions (e.g., Mg$^{2+}$, Ca$^{2+}$, Ba$^{2+}$, Zn$^{2+}$, Sc$^{3+}$, Y$^{3+}$ and La$^{3+}$) were used. A relevant material was used as anode and a similar cell was utilized (FIG. 2A). Similar to the case of monovalent metal ions, the intercalation was also performed by ⅛, ¼, ½, ¾ and 1C of maximum capacity of EC material using a potentiostat/galvanostat. During the subsequent post-annealing process, a "split" of the EC film occurred, so vertical channels were formed, and surface area was significantly increased. During that, crystallites formation was observed, which crystallites had composition of M(II, III)$_x$WO$_{2.4-2.9}$:M1:M2:E1:E2:E3 where x=0.1 . . . 0.25 for M(II)$^{2+}$ and x=0.1 . . . 0.15 for M(III)$^{3+}$.

In the case of intercalation of multivalent metal ions, their ion radius is larger than that of lithium ions, so "splitting" the EC film and increasing its surface area were achieved with subsequent post-annealing process at a much lower temperature, which was important when organic substrates were used.

EC films obtained by this method may be used in cells with monovalent metal ions (Li$^+$, Na$^+$ or K$^+$). Their coloring speed was also significantly increased. Furthermore, cycling resistance of the material structured by this approach was significantly improved.

It should be noted that the method for increasing surface area without post-annealing (or with low temperature post-annealing) might be more attractive from a manufacturing point of view, because there is no need for an additional high temperature post-annealing operation in this case. However, EC materials with nano-crystallites formed using post-annealing at a high temperature (450-550° C.) are more resistant to cycling.

New heavily doped EC materials $WO_{2.4-2.9}$:M1:M2:E1: E2:E3 are proposed, which are colored to blue, grey-blue, grey, black and brown tints upon ion intercalation. These materials were synthesized by reactive magnetron co-sputtering with mandatory use of either one or several carbon-containing targets (carbides, graphite composites or pure graphite). Post-annealing at a high temperature and pre-intercalation were also used. The materials synthesized according to this approach showed higher electron and ion conductivity.

Pre-intercalation may be performed by both monovalent and multivalent ions with formation of compositions M(I)$_{0.1-0.65}$WO$_{2.4-2.9}$:M1:M2:E1:E2:E3, M(II)$_{0.1-0.25}$WO$_{2.4-2.9}$:M1:M2:E1:E2:E3 and M(III)$_{0.1-0.15}$WO$_{2.4-2.9}$:M1:M2:E1:E2:E3. The coloring speed is higher when multivalent ions are used.

The method of modification of the material by pre-intercalation of the EC layer followed by "thermo-splitting" during post-annealing is proposed according to the invention. In this case, the EC material is structured in such a way that vertical nano-sized channels are formed, which facilitates subsequent intercalation and de-intercalation of metal ions during normal operation of the EC material. As a result, speed of coloring and bleaching increases 5-10 times. Additionally, crystallites formed under high temperature post-annealing are more resistant to cycling, so lifetime of the EC material essentially increases.

Table 1 below shows EC material transmittance T depending on EC material capacity for Li$_x$WAlCNO$_{2.6}$.

TABLE 1

| Relative Charge C | Absolute Charge coulomb | Absolute Charge mAh/g | Ratio η(Li$^+$)/η(LiWO$_3$) mol % | T (%) |
| --- | --- | --- | --- | --- |
| 0.125 | 0.08 | 1.62 | 1.44 | 73.804 |
| 0.250 | 0.16 | 3.24 | 2.88 | 70.510 |
| 0.500 | 0.32 | 6.47 | 5.77 | 53.864 |
| 0.750 | 0.48 | 9.71 | 8.65 | 40.064 |
| 1.000 | 0.64 | 12.95 | 11.54 | 20.564 |
| 1.560 | 1.00 | 20.23 | 18.03 | 10.169 |

In Table 1, 1C is average 100% reversible coloring capacity for the doped EC materials based on WO$_3$ matrix. Reversible coloring capacity means capacity to provide fully reversible coloring and bleaching in the EC material. There is technically no degradation and "deep ion trapping" effect at 1C with use of organic liquid electrolytes.

In some cases, the obtained EC materials had a large theoretical capacity 300-320 mAh/g, and with some dopant materials in tungsten oxide matrix, their measured real capacity was 240-250 mAh/g during tests, which significantly exceeds capacity of currently used cathode materials for lithium-ion batteries (theoretical capacity of $LiCoO_2$~140 mAh/g, $LiMn_2O_4$~148 mAh/g, $LiFePO_4$~170 mAh/g, etc.), see [20]. Thus, the materials obtained by the inventors are promising for use in electrochemical current sources as cathode materials.

On the one hand, high capacity may be advantageous when the EC materials are used in electrochemical current sources, e.g., in combined EC/photovoltaic devices. On the other hand, such a high capacity may be a negative factor for some EC devices, as transition from the uncolored state to the colored state or vice versa may require more energy. In view of this, it should be noted that in spite of a high theoretical capacity of $Li_xWO_{2.4-29}$:M1:M2:E1:E2:E3 obtained according to the invention (theoretically this material may be intercalated with lithium ions up to x=3), its EC effect becomes apparent when only 6-10% of the theoretical capacity is charged or discharged, which corresponds to intercalation value of approximately x=0.18 . . . 0.3 (FIG. 3). In other words, high capacity of these materials is not a serious limitation in terms of power consumption for the application of EC devices. Moreover, the lifetime of such devices would be higher because of mild cycling conditions in the EC mode.

EXAMPLES

Description of examples of $WO_{2.4-2.9}$:M1:M2:E1:E2:E3 samples built by the inventors during prototyping is further provided to demonstrate attaining the claimed technical result.

Example 1

$W_{0.89}O_{2.6}$:$Al_{0.39}$:$C_{0.02}$:$N_{0.01}$ cathode EC material was synthesized from three targets, W, Al and Graphite, in $Ar/O_2/N_2$ atmosphere by PDC reactive magnetron co-sputtering onto a Glass/FTO substrate at a room temperature. The thickness of the EC layer was 500-1000 nm. Sputtering pressure was 10 mT, and total gas flow was 80 sccm with 6 sccm of $O_2$ and 24 sccm of $N_2$. Post-annealing was performed in a muffle oven at 500° C. in air atmosphere. Optical, electrochemical and dynamic switching measurements were performed in a liquid cell. The obtained EC material had deep blue color in the colored state and showed excellent switching time in PC-$LiClO_4$ electrolyte (approximately 20-60 seconds for both colored and uncolored states) at 1.0-2.0 V using $LiFePO_4$ as a counter electrode. Maximum transmittance of the film in the visible range was approximately 76% in the uncolored state and less than 0.3% in the colored state. There was no residual blue color after $Li^+$ deintercalation in the uncolored state.

Example 2

$W_{0.9}O_{2.6}$:$Cr_{0.22}$:$C_{0.12}$:$N_{0.01}$ cathode EC material was synthesized from two targets, W and CrC, in $Ar/O_2/N_2$ atmosphere by PDC reactive magnetron co-sputtering onto a Glass/FTO substrate at a room temperature. Thickness of the EC layer was 350-1000 nm. Sputtering pressure was 10 mT, and total gas flow was 80 sccm with 24 sccm of $O_2$ and 6 sccm of $N_2$. Post-annealing was performed in a muffle oven at 450° C. in air atmosphere. Optical, electrochemical and dynamic switching measurements were performed in a liquid cell. The obtained EC material had graphite-grey color in the colored state and showed an excellent switching time in PC-$LiClO_4$ electrolyte (approximately 20-30 seconds for both colored and uncolored states) at 2.0 V with $LiFePO_4$ counter electrode. Maximum transmittance in the visible range was approximately 71% in the uncolored state and less than 4% in the colored state. The sputtered film had a tiny brown tint after post-annealing (in the uncolored state) and this tint became less after a couple of intercalation/deintercalation cycles.

Example 3

$W_{0.9}O_{2.6}$:$Cr_{0.23}$:$C_{0.14}$:$H_{0.01}$:$N_{0.01}$ cathode EC material was synthesized from three targets, W, Cr and Graphite, in $Ar/CH_4/N_2/O_2$ atmosphere by PDC reactive magnetron co-sputtering onto a Glass/FTO substrate at a room temperature. Thickness of the EC layer was 350-1000 nm. Sputtering pressure was 10 mT, and total gas flow was 80 sccm with 24 sccm of $O_2$ and 6 sccm of $N_2$. Post-annealing was performed in a muffle oven at 450° C. in air atmosphere. Optical, electrochemical and dynamic switching measurements were performed in a liquid cell. The obtained EC material had almost black color in the colored state and still showed a good switching time in PC-$LiClO_4$ electrolyte (approximately 60 seconds for the colored state and 90 seconds for the uncolored state) at 2.0V with $LiFePO_4$ counter electrode. Maximum transmittance in the visible range was approximately 65% in the uncolored state and less than 1% in the colored state. The sputtered film had a brown tint after post-annealing (in the uncolored state) and this color stay almost the same after a number of intercalation/deintercalation cycles.

Example 4

$W_{0.61}O_{2.6}$:$Al_{0.78}$:$C_{0.13}$:$H_{0.01}$:$N_{0.02}$ cathode EC material was synthesized from three targets, W, Al and Graphite, in $Ar/NH_3/CO/N_2/O_2$ atmosphere by PDC reactive magnetron co-sputtering onto a Glass/FTO substrate at a room temperature. Thickness of the EC layer was 500-1000 nm. Sputtering pressure was 10 mT, and total gas flow was 80 sccm with 4 sccm of $O_2$ and 26 sccm of $N_2$. Post-annealing was performed in a muffle oven at 550° C. in air atmosphere. Optical, electrochemical and dynamic switching measurements were performed in a liquid cell. The obtained EC material had blue color in the colored state and showed an average switching time in PC-$LiClO_4$ electrolyte (approximately 90 seconds for the colored state and 150 seconds for and uncolored state) at 1.0-2.0V using $LiFePO_4$ or $LiCoO_2$ as a counter electrode. Maximum transmittance of the film in the visible range was approximately 62% in the uncolored state and less than 10% in the colored state. There were also some residual blue coloring after $Li^+$ deintercalation (in the uncolored state), which cannot be removed if the layer thickness is over 500 nm.

Example 5

$W_{0.89}O_{2.9}$:$Nb_{0.28}$:$C_{0.12}$:$N_{0.01}$ cathode EC material was synthesized from three targets, W, Nb and Graphite, in $Ar/N_2/O_2$ atmosphere by PDC reactive magnetron co-sputtering onto a Glass/FTO substrate at a room temperature. Thickness of the EC layer was 500-1000 nm. Sputtering pressure was 10 mT, and total gas flow was 80 sccm with 10 sccm of $O_2$ and 20 sccm of $N_2$. Post-annealing was performed in a muffle oven at 450° C. in air atmosphere. Optical, electrochemical and dynamic switching measurements were performed in a liquid cell. The obtained EC material had almost blue color in the colored state and showed an average switching time in PC-LiClO$_4$ electrolyte (approximately 120 seconds for the colored state and 240 seconds for the uncolored state) at 1.0-2.0 V with LiFePO$_4$ counter electrode. Maximum transmittance in the visible range was approximately 75% in the uncolored state and less than 2% in the colored state. The sputtered film had no any tint after post-annealing (in the uncolored state) and seemed to be fairly colorless in the visible range. However, the material may have some residual blue coloring after Li$^+$ deintercalation (in the uncolored state) if the layer thickness is over 1500 nm.

Example 6

$W_{0.9}O_{2.6}$:$Ni_{0.28}$:$V_{0.06}$:$Si_{0.12}$:$C_{0.05}$:$N_{0.01}$ cathode EC material was synthesized from three targets, W, NiV7 and SiC, in Ar/N$_2$/O$_2$ atmosphere by PDC reactive magnetron co-sputtering onto a Glass/FTO substrate at a room temperature. Thickness of the EC layer was 500-2500 nm. Sputtering pressure was 10 mT, and total gas flow was 80 sccm with 8 sccm of O$_2$ and 22 sccm of N$_2$. Post-annealing was performed in a muffle oven at 500° C. in air atmosphere. Optical, electrochemical and dynamic switching measurements were performed in a liquid cell. The obtained EC material had a kind of "dirty" blue color in the colored state and showed a good switching time in PC-LiClO$_4$ electrolyte (approximately 90 seconds for the colored state and 120 seconds for the uncolored state) at 1.0-2.0 V with LiFePO$_4$ counter electrode. Maximum transmittance in the visible range was approximately 66% in the uncolored state and less than 3% in the colored state. The sputtered film had a light brown color (in the uncolored state), and loosed most of its color after post-annealing. The material may have some residual color after Li$^+$ deintercalation, if the layer thickness is over 1000 nm.

Example 7

$W_{1.05}O_{2.6}$:$Al_{0.07}$:$Si_{0.06}$:$B_{0.05}$:$C_{0.02}$:($N_{0.001}$) cathode EC material was synthesized from three targets, W, AlSi-composite, and BC-composite, in Ar/O$_2$/N$_2$ atmosphere by PDC reactive magnetron co-sputtering onto a Glass/FTO substrate at a room temperature. Thickness of the EC layer was 500-2500 nm. Sputtering pressure was 10-15 mT, and total gas flow was 80 sccm with 11 sccm of O$_2$ and 19 sccm of N$_2$. Post-annealing was performed in a muffle oven at 550° C. in air atmosphere. Optical, electrochemical and dynamic switching measurements were performed in a liquid cell. The obtained EC material had deep grey blue color in the colored state and showed a quite good switching time in PC-LiClO$_4$ electrolyte (approximately 60 seconds for the colored state and 120 seconds for the uncolored state) at 1.0-2.0V with LiFePO$_4$ counter electrode. Maximum transmittance in the visible range was approximately 70% in the uncolored state and less than 1% in the colored state. The sputtered film had a light grey tint after post-annealing (in the uncolored state). The material had almost no residual bluish color after Li+deintercalation.

Example 8

$W_{0.58}O_{2.9}$:$Ni_{0.63}$:$B_{0.07}$:$P_{0.05}$:$C_{0.02}$:($N_{0.001}$) cathode EC material was synthesized from two targets, WNi, and BPC composite, in Ar/O$_2$/N$_2$ atmosphere by PDC reactive magnetron co-sputtering onto a Glass/FTO substrate at a room temperature. Thickness of the EC layer was 500-2500 nm. Sputtering pressure was 10-15 mT, and total gas flow was 80 sccm with 4 sccm of O$_2$ and 26 sccm of N$_2$. Post-annealing was performed in a muffle oven at 550° C. in air atmosphere. Optical, electrochemical and dynamic switching measurements were performed in a liquid cell. The obtained EC material had brown color in the colored state and showed an average switching time in PC-LiClO$_4$ electrolyte (approximately 120 seconds for the colored state and 240 seconds for the uncolored state) at 1.5-2.0V with LiFePO$_4$ counter electrode. Maximum transmittance in the visible range was approximately 62% in the uncolored state and less than 3% in the colored state. The sputtered film had a light brown tint (in the uncolored state) after post-annealing and retained some residual brown color after Li$^+$ deintercalation.

Example 9

$W_{0.9}O_{2.6}$:$Al_{0.16}$$Mn_{0.08}$:$C_{0.02}$:$N_{0.01}$ cathode EC material was synthesized from three targets, W, Al, MnC-composite, in Ar/CO/N$_2$/O$_2$ atmosphere by PDC reactive magnetron co-sputtering onto a Glass/FTO substrate at a room temperature. Thickness of the EC layer was 500-2500 nm. Sputtering pressure was 10 mT, and total gas flow was 80 sccm with 6 sccm of O$_2$ and 24 sccm of N$_2$. Post-annealing was performed in a muffle oven at 500° C. in air atmosphere. Optical, electrochemical and dynamic switching measurements were performed in a liquid cell. The obtained EC material had deep blue color in the colored state and showed a good switching time in PC-LiClO$_4$ electrolyte (approximately 80 seconds for the colored state and 160 seconds for the uncolored state) at 1.0-2.0V with LiFePO$_4$ counter electrode. Maximum transmittance in the visible range was approximately 73% in the uncolored state and less than 1% in the colored state. The sputtered film is almost colorless after post-annealing. The material had no residual blue coloring after Li$^+$ deintercalation (in the uncolored state).

Example 10

Split $W_{1.0}O_{2.6}$:$Al_{0.06}$:$C_{0.15}$:$N_{0.01}$ cathode EC material was synthesized from three targets, W, Al and Graphite, in Ar/O$_2$/N$_2$ atmosphere by PDC reactive magnetron co-sputtering onto a Glass/FTO substrate at a room temperature. Thickness of the EC layer was 500-1000 nm. Sputtering pressure was 10 mT, and total gas flow was 80 sccm with 24 sccm of O$_2$ and 6 sccm of N$_2$. Preintercalation by Li$^+$ ions was made in a liquid cell with PC-LiClO$_4$ electrolyte and Li foil as a counter electrode to provide approximately $Li_{(0.22-0.64)}W_{1.0}O_{2.6}$:$Al_{0.06}$:$C_{0.15}$:$N_{0.01}$ film. This material was post-annealed in an RTA oven at 450° C. in argon atmosphere. After post-annealing, reverse Li$^+$ deintercalation was performed. Optical, electrochemical and dynamic switching measurements were made in a liquid cell. The obtained EC material had deep blue color in the colored state and showed an excellent switching time in PC-LiClO$_4$ electrolyte (25-70 seconds for both colored and uncolored states) at 1.0-2.0 V using LiFePO$_4$ as a counter electrode. Maximum transmittance of the split film in the visible range was approximately 75% in the uncolored state and less than 0.2% in the colored state. There was some residual blue coloring after Li$^+$ deintercalation (in the uncolored state).

Example 11

Split $W_{0.97}O_{2.8}$:$Cr_{0.23}$:$C_{0.04}$:$N_{0.01}$ cathode EC material was synthesized from three targets, W, Cr and Graphite, in Ar/O$_2$/N$_2$ atmosphere by PDC reactive magnetron co-sputtering onto a Glass/FTO substrate at a room temperature. Thickness of the EC layer was 500-2500 nm. Sputtering pressure was 10 mT, and total gas flow was 80 sccm with 24 sccm of O$_2$ and 6 sccm of N$_2$. Preintercalation by Li$^+$ ions was made in a liquid cell with PC-LiClO$_4$ electrolyte and Li foil as a counter electrode to provide approximately Li$_{(0.18-0.25)}$W$_{0.97}$O$_{2.8}$:Cr$_{0.23}$:C$_{0.04}$:N$_{0.01}$ film. This material was post-annealed in an RTA oven at 450° C. in argon atmosphere. After post-annealing, reverse Li$^+$ deintercalation was performed. Optical, electrochemical and dynamic switching measurements were performed in a liquid cell. The obtained EC material had black color in the colored state and showed an excellent switching time in PC-LiClO$_4$ electrolyte (approximately 20 seconds for the colored state and 60 seconds for the uncolored state) at 2.0 V with LiFePO$_4$ counter electrode. Maximum transmittance in the visible range was approximately 70% in the uncolored state and less than 3% in the colored state. The split film was slightly brown after post-annealing. The material almost had no residual coloring after Li$^+$ deintercalation (in the uncolored state).

Example 12

Split W$_{1.0}$O$_{2.6}$:Al$_{0.06}$:C$_{0.15}$:H$_{0.01}$:N$_{0.02}$ cathode EC material was synthesized from three targets, W, Al and Graphite, in Ar/NH$_3$/CO/N$_2$/O$_2$ atmosphere by PDC reactive magnetron co-sputtering onto a Glass/ITO substrate at a room temperature. Thickness of the EC layer was 500-2500 nm. Sputtering pressure was 10 mT, and total gas flow was 80 sccm with 24 sccm of O$_2$ and 6 sccm of N$_2$. Pre-intercalation by Zn$^{2+}$ ions was made in a liquid cell with PC-Zn(ClO$_4$)$_2$ electrolyte and Zn foil as a counter electrode to provide approximately Zn$_{(0.1-0.15)}$W$_{1.0}$O$_{2.6}$:Al$_{0.06}$:C$_{0.15}$:H$_{0.01}$:N$_{0.02}$ film. This material was post-annealed at 250° C. in argon atmosphere. After low temperature post-annealing, reverse Zn$^{2+}$ deintercalation was performed. Optical, electrochemical and dynamic switching measurements were performed in a liquid cell with PC-LiClO$_4$ electrolyte. The obtained EC material had deep blue color in the colored state and showed a good switching time in PC-LiClO$_4$ electrolyte (approximately 90 seconds for the colored state and 240 seconds for the uncolored state) at 2.0 V with LiFePO$_4$ counter electrode. Maximum transmittance in the visible range was approximately 71% in the uncolored state and less than 3% in the colored state. The low temperature split film was slightly blue after low temperature post-annealing and subsequent Li$^+$ intercalation/deintercalation cycles (in the uncolored state). Possibly, the material had some "trapped" Zn$^{2+}$ ions after the splitting process.

CONCLUSION

Through the tungsten oxide deep doping method, the inventors have developed new EC materials WO$_{2.4-2.9}$:M1:M2:E1:E2:E3 having a fairly wide range of colors—tints of blue, grey-blue, grey, black and brown colors. They have been synthesized via reactive magnetron co-sputtering from several targets simultaneously depositing in mixtures of several gases. One of the targets always should be a carbon containing material, for instance metal or nonmetal carbide, composite mixture of metal and graphite or pure graphite. The reactive gas mixture in which sputtering is conducted always contains a nitrogen source in the form of N$_2$ or NH$_3$, and may also include carbon containing gases CO or CH$_4$. It is important to conduct post-annealing the EC films at very high temperatures (450-550° C.) in most cases. The inventive approach results in formation of EC materials having much higher electron and ion conductivity, which enables production of thicker EC layers without decreasing coloring and bleaching speed.

Novel structuring methods of EC materials through the pre-intercalation approach followed by "thermo-split" at post-annealing are also proposed. Pre-intercalation is conducted by monovalent and/or multivalent metal ions.

It should be noted that use of multivalent ions accelerates the EC material coloring speed, as one charged particle carries two or three times more total charge during one action and the reduction process of tungsten with dopants is faster. However, since multivalent ions generally have a larger ionic radius, their reverse diffusion during bleaching in the EC material may be hampered.

Moreover, the materials obtained and structuring methods applied are promising for use in production of cathode materials for primary and secondary electrochemical power sources. Such cathode materials have large capacity and power and remain functional in a wide temperature range without visible degradation, which may be crucial for many applications of such power sources.

The term "approximately" or "substantially" used herein means that the related numeric or other value may reasonably vary, e.g., depending on manufacturing tolerance and/or measurement accuracy. In some cases, it may mean that the actual numeric value may vary by ±5% or ±10% relatively to the indicated value.

Having thus described preferred embodiments, it should be apparent to those skilled in the art that certain advantages of the described method and apparatus have been achieved. It should also be apparent to those skilled in the art that the above examples are merely illustrations of the claimed invention and the description is intended to cover all combinations of the claimed ranges of features. General knowledge of EC theory and some partial experiments performed by the inventors allow them to state that any combination of the parameters discussed herein provides attaining at least one of the following advantageous effects: possibility of obtaining different colors of the EC materials; improved speed of coloring and/or uncoloring; extended lifetime; widened operational temperature range of the EC materials; possibility of implementing combined EC/photovoltaic devices having competitive properties.

It should also be appreciated that various modifications, adaptations, and alternative embodiments thereof may be made within the scope and spirit of the present invention. The invention is further defined by the following claims.

REFERENCES (ALL INCORPORATED HEREIN IN THEIR ENTIRETY)

1. Niklasson, G. A. & Granqvist, C. G., Electrochromics for smart windows: thin films of tungsten oxide and nickel oxide, and devices based on these, *J. Mater. Chem.* 17, 127-156 (2007).
2. Granqvist, C. G., Niklasson, G. A. & Azens, A., Electrochromics: Fundamentals and energy-related applications of oxide-based devices, *Appl. Phys. A Mater. Sci. Process.* 89, 29-35 (2007).
3. Piccolo, A. & Simone, F. Energy performance of an all solid state electrochromic prototype for smart window applications, *Energy Procedia* 78, 110-115 (2015).
4. Sbar, N. L., Podbelski, L., Yang, H. M. & Pease, B., Electrochromic dynamic windows for office buildings, *Int. J. Sustain. Built Environ.* 1, 125-139 (2012).

5. Avendaño, E., Berggren, L., Niklasson, G. A., Granqvist, C. G. & Azens, A., Electrochromic materials and devices: Brief survey and new data on optical absorption in tungsten oxide and nickel oxide films, *Thin Solid Films* 496, 30-36 (2006).
6. Lampert, C. M., Large-area smart glass and integrated photovoltaics, *Sol. Energy Mater. Sol. Cells* 76, 489-499 (2003).
7. Gui, Y. & Blackwood, D. J., Electrochromic Enhancement of $WO_3$-$TiO_2$ Composite Films Produced by Electrochemical Anodization, *J. Electrochem. Soc.* 161, E191-E201 (2014).
8. Avellaneda, C. O. & Bulhões, L. O. S., Photochromic properties of $WO_3$ and $WO_3$:X (X=Ti, Nb, Ta and Zr) thin films, *Solid State Ionics* 165, 117-121 (2003).
9. Taurino, A., Catalano, M., Rella, R., Siciliano, P. & Wlodarski, W., Structural and optical properties of molybdenum-tungsten mixed oxide thin films deposited by the sol-gel technique, *J. Appl. Phys.* 93, 3816-3822 (2003).
10. Bathe, S. R. & Patil, P. S., Electrochemical Behavior of $TiO_2$ Nanoparticle Doped $WO_3$ Thin Films, 2014, 3-8 (2014).
11. Monk, P. M. S., Akhtar, S. P., Boutevin, J. & Duffield, J. R., Toward the tailoring of electrochromic bands of metal-oxide mixtures, *Electrochim. Acta* 46, 2091-2096 (2001).
12. Dautremont-Smith, W. C., Transition metal oxide electrochromic materials and displays: a review. Part 1: oxides with cathodic coloration, *Displays* 3, 3-22 (1982).
13. Jittiarporn, P., Badilescu, S., Al Sawafta, M. N., Sikong, L. & Truong, V.-V., Electrochromic properties of sol-gel prepared hybrid transition metal oxides—A short review, *J. Sci. Adv. Mater. Devices* 2, 286-300 (2017).
14. Sun, X., Liu, Z. & Cao, H., Electrochromic properties of N-doped tungsten oxide thin films prepared by reactive DC-pulsed sputtering, *Thin Solid Films* 519, 3032-3036 (2011).
15. Shein, I. R. & Ivanovskii, a. L., Effect of fluorine, nitrogen, and carbon impurities on the electronic and magnetic properties of $WO_3$, *Semiconductors* 47, 740-744 (2013).
16. Chen, Y. et al., Electrochromic properties of Ni—W Oxide thin films by reactive magnetron sputtering, *Energy Procedia* 57, 1834-1841 (2014).
17. Thummavichai, K. et al. Low Temperature Annealing Improves the Electrochromic and Degradation Behavior of Tungsten Oxide ($WO_x$) Thin Films. *J. Phys. Chem. C* 121, 20498-20506 (2017).
18. Yang He, Meng Gu, Haiyan Xiao, Atomistic Conversion Reaction Mechanism of $WO_3$ in Secondary Ion Batteries of Li, Na, and Ca. Angewandte Chemie International Edition, Issue 55(21), p. 6244-6247, 2016 DOI 10.1002/anie.201601542
19. Lars Berggren, Gunnar A. Niklasson, Optical charge transfer absorption in lithium-intercalated tungsten oxide thin films. Applied Physics Letters, Volume 88, Issue 8, 081906 (2006) DOI 10.1063/1.2177548
20. Lars Berggren, Jacob C. Jonsson, Gunnar A. Niklasson, Optical absorption in lithiated tungsten oxide thin films: Experiment and theory. Journal of Applied Physics, Volume 102, Issue 8, 083538 (2007) DOI 10.1063/1.2800838
21. S. Green, J. Backholm, P.Georén, C. G. Granqvist, G.A. Niklasson, Electrochromism in nickel oxide and tungsten oxide thin films: Ion intercalation from different electrolytes. Solar Energy Materials and Solar Cells, Volume 93, Issue 12, December 2009, p. 2050-2055 DOI 10.1016/j.solmat.2009.05.009
22. Sunnie H. N. Lim, Jan Isidorsson, Lizhong Sun, B. Leo Kwak, André Anders, Modeling of optical and energy performance of tungsten-oxide-based electrochromic windows including their intermediate states. Solar Energy Materials and Solar Cells, Volume 108, January 2013, p. 129-135 DOI 10.1016/j.solmat.2012.09.010
23. Xilian Sun, Zhimin Liu, Hongtao Cao, Electrochromic properties of N-doped tungsten oxide thin films prepared by reactive DC-pulsed sputtering. Thin Solid Films, Volume 519, Issue 10, 1 Mar. 2011, p. 3032-3036 DOI 10.1016/j.tsf.2010.12.017
24. Horng-Hwa Lu, Effects of oxygen contents on the electrochromic properties of tungsten oxide films prepared by reactive magnetron sputtering. Journal of Alloys and Compounds Volume 465, Issues 1-2, 6 Oct. 2008, p. 429-435 DOI 10.1016/j.jallcom.2007.10.105
25. M. C. Rao, Structure and properties of $WO_3$ thin films for electrochromic device application, Journal of Non-Oxide Glasses Vol. 5, No. 1, 2013, p. 1-8
26. Peihua Yang, Peng Sun, Wenjie Mai, Electrochromic energy storage devices. Materials Today, Volume 19, Issue 7, September 2016, p. 394-402 DOI 10.1016/j.mattod.2015.11.007
27. V. Madhavi, P. Jeevan Kumar, P. Kondaiah, O.M. Hussain, S. Uthanna, Effect of molybdenum doping on the electrochromic properties of tungsten oxide thin films by RF magnetron sputtering. Ionics, December 2014, Volume 20, Issue 12, p. 1737-1745 DOI 10.1007/s11581-014-1073-8
28. G. A. Niklasson, A. Norling, G. Possnert, L. Berggren, Optical properties of amorphous tungsten oxide films: Effect of stoichiometry. Journal of Physics: Conference Series, Volume 100, Part 8, 2008, p. 082023
29. Kunyapat Thummavichai, Liam Trimby, Nannan Wang, C. David Wright, Yongde Xia, Yanqiu Zhu, Low temperature annealing improves the electrochromic and degradation behavior of tungsten oxide ($WO_x$) thin films. J. Phys. Chem. C, 2017, 121 (37), pp 20498-20506 DOI 10.1021/acs.jpcc.7b06300
30. Liu, H.-S. et al., Highly transparent to truly black electrochromic devices based on an ambipolar system of polyamides and viologen, *NPG Asia Mater.* 9, e388 (2017).
31. Yang, P., Sun, P., Mai, W., Electrochromic energy storage devices, *Mater. Today* 19, 394-402 (2016).

The invention claimed is:

1. An electrochromic material, comprising
tungsten oxide having a formula $WO_{2.4-2.9}$:M1:M2:E1:E2:E3 or $WO_{2.4-2.9}$:M1:E1:E2:E3 or $WO_{2.4-2.9}$:M1:M2:E1:E2, wherein M1 is a dopant selected from Mo, Ti, Ni, Zr, V, Cr, Al, Nb, Ta, Co, Mn;

M2 is a dopant selected from Mo, Ti, Ni, Zr, V, Cr, Al, Nb, Ta, Co, Mn;

E1 is a dopant selected from H, N, C, Si, Ge, P, B;

E2 is a dopant selected from H, N, C, Si, Ge, P, B; and

E3 is a dopant selected from H, N, C, Si, Ge, P, B, such that M1≠M2, E1≠E2≠E3.

2. The electrochromic material of claim 1, having formula $M(I)_{0.1-3.0}WO_{2.4-2.9}$:M1:M2:E1:E2:E3, wherein M(I) is added to the tungsten oxide and is selected from group 1 elements: $Li^+$, $Na^+$, $K^+$.

3. The electrochromic material of claim 1, having formula $M(II)_{0.1-1.5}WO_{2.4-2.9}$:M1:M2:E1:E2:E3, wherein M(II) is added to the tungsten oxide and is selected from group 2 elements: $Mg^{2+}$, $Ca^{2+}$, $Ba^{2+}$, $Zn^{2+}$.

4. The electrochromic material of claim 1, having formula $M(III)_{0.1-1.0}WO_{2.4-2.9}$:M1:M2:E1:E2:E3, wherein M(III) is added to the tungsten oxide and is selected from group 3 elements: $Sc^{3+}$, $Y^{3+}$ and lanthanides with atomic numbers 57-71.

5. The electrochromic material of claim 1, wherein the electrochromic material is used to form a cathode.

6. The electrochromic material of claim 1, wherein the electrochromic material is used to form an anode.

7. The electrochromic material of claim 1, wherein the electrochromic material is at least partially crystalline.

8. A method of manufacturing an electrochromic material, the method comprising:
using magnetron co-sputtering of metal and carbide-based materials or of metal and graphite-based materials to obtain the electrochromic material that includes tungsten oxide having a formula $WO_{2.4-2.9}$:M1:M2:E1:E2:E3 or $WO_{2.4-2.9}$:M1:E1:E2:E3 or $WO_{2.4-2.9}$:M1:M2:E1:E2, wherein
M1 is a dopant selected from Mo, Ti, Ni, Zr, V, Cr, Al, Nb, Ta, Co, Mn;
M2 is a dopant selected from Mo, Ti, Ni, Zr, V, Cr, Al, Nb, Ta, Co, Mn;
E1 is a dopant selected from H, N, C, Si, Ge, P, B;
E2 is a dopant selected from H, N, C, Si, Ge, P, B; and
E3 is a dopant selected from H, N, C, Si, Ge, P, B,
such that M1≠M2, E1≠E2≠E3; and
post-annealing the electrochromic material at a temperature between approximately 100° C. and approximately 550° C.

9. The method of claim 8, wherein the post-annealing is performed at a temperature between approximately 450° C. and approximately 550° C.

10. The method of claim 8, further comprising pre-intercalation of the electrochromic material before the post-annealing, with $Li^+$, followed by the post-annealing at a temperature between approximately 250° C. and approximately 450° C.

11. The method of claim 8, further comprising pre-intercalation of the electrochromic material before the post-annealing, with $Na^+$ or $K^+$, followed by the post-annealing at a temperature between approximately 250° C. and approximately 450° C. and subsequent deintercalation.

12. The method of claim 8, further comprising pre-intercalation of the electrochromic material before the post-annealing, with $Mg^{2+}$, $Ca^{2+}$, $Ba^{2+}$ or $Zn^{2+}$, followed by the post-annealing at a temperature between approximately 250° C. and approximately 450° C. and subsequent deintercalation.

13. The method of claim 8, further comprising pre-intercalation of the electrochromic material before the post-annealing, with $Sc^{3+}$, $Y^{3+}$ or a lanthanide with atomic number 57-71, followed by the post-annealing at a temperature between approximately 100° C. and approximately 250° C. and subsequent deintercalation.

14. The method of claim 10, wherein the post-annealing is performed to provide splitting the electrochromic material.

15. The method of claim 10, wherein the pre-intercalation is performed in a liquid cell.

16. The method of claim 11, wherein the deintercalation is performed in a liquid cell.

17. The method of claim 16, wherein the deintercalation is performed under negative polarity at approximately room temperature.

18. The method of claim 8, wherein the magnetron co-sputtering is magnetron reactive co-sputtering performed in a gas mixture comprising one of the following combinations: $Ar/O_2/N_2$, $Ar/H_2/N_2/O_2$, $Ar/NH_3/O_2$, $Ar/CO/N_2/O_2$, $Ar/CO/H_2/N_2/O_2$, $Ar/CH_4/N_2/O_2$ and $Ar/NH_3/CO/N_2/O_2$.

19. The method of claim 18, wherein pressure of the gas mixture ranges from approximately 5 millitorr to approximately 15 millitorr.

20. The method of claim 18, wherein flow of the gas mixture ranges from approximately 80 sccm to approximately 100 sccm.

21. The method of claim 11, wherein the post-annealing is performed to provide splitting the electrochromic material.

22. The method of claim 11, wherein the pre-intercalation is performed in a liquid cell.

23. The method of claim 12, wherein the post-annealing is performed to provide splitting the electrochromic material.

24. The method of claim 12, wherein the pre-intercalation is performed in a liquid cell.

25. The method of claim 12, wherein the deintercalation is performed in a liquid cell.

26. The method of claim 13, wherein the post-annealing is performed to provide splitting the electrochromic material.

27. The method of claim 13, wherein the pre-intercalation is performed in a liquid cell.

28. The method of claim 13, wherein the deintercalation is performed in a liquid cell.

* * * * *